US006987698B2

(12) United States Patent
Bando et al.

(10) Patent No.: US 6,987,698 B2
(45) Date of Patent: Jan. 17, 2006

(54) SEMICONDUCTOR MEMORY HAVING DUMMY REGIONS IN MEMORY CELL ARRAY

(75) Inventors: Yoshihide Bando, Kawasaki (JP); Yoshimasa Yagishita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 50 days.

(21) Appl. No.: 10/289,314

(22) Filed: Nov. 7, 2002

(65) Prior Publication Data

US 2003/0218900 A1 Nov. 27, 2003

(30) Foreign Application Priority Data

May 21, 2002 (JP) .............................. 2002-145716

(51) Int. Cl.
*G11C 7/00* (2006.01)

(52) U.S. Cl. ............. 365/189.07; 365/205; 365/230.03

(58) Field of Classification Search ........... 365/189.07, 365/149, 230.03, 185.11, 185.19, 185.23, 365/185.29, 205

See application file for complete search history.

(56) References Cited

U.S. PATENT DOCUMENTS

| 5,694,369 | A  | * | 12/1997 | Abe ........................... 365/210 |
| 6,490,214 | B2 | * | 12/2002 | Kawasumi ................... 365/210 |
| 6,525,979 | B2 | * | 2/2003  | Kato .......................... 365/210 |
| 6,535,439 | B2 | * | 3/2003  | Cowles ....................... 365/201 |
| 6,587,385 | B2 | * | 7/2003  | Ooishi ........................ 365/191 |

FOREIGN PATENT DOCUMENTS

| JP | 61-206254   | 9/1986 |
| JP | 02-091884   | 3/1990 |
| JP | 2002-032994 | 1/2002 |

* cited by examiner

*Primary Examiner*—Hoai Ho
(74) *Attorney, Agent, or Firm*—Arent Fox, PLLC.

(57) ABSTRACT

A memory cell array is partitioned into a plurality of memory regions each of which includes a plurality of sense amplifiers and each of which is established as a unit of data input/output. Dummy regions each are formed between every two memory regions and include dummy bit lines that are set to a predetermined voltage at least during the operation of the memory cell array. Since the dummy bit lines are wired between the bit lines of the two adjacent memory regions, the voltage change in the bit lines in any of the memory regions can be prevented from affecting the bit lines in the other memory regions. As a result, malfunction of semiconductor memories can be prevented.

10 Claims, 11 Drawing Sheets

Prior Art read operation write operation read operation write operation

SEMICONDUCTOR MEMORY HAVING DUMMY REGIONS IN MEMORY CELL ARRAY

BACKGROUND OF THE INVENTION

1. Field of the Invention

The present invention relates to a technique for suppressing coupling noise occurring between bit lines connected to memory cells of a semiconductor memory to prevent malfunction of the semiconductor memory.

2. Description of the Related Art

FIG. 1 shows a schematic view of a memory cell array of a typical DRAM. In this example, four-bit data DQ0–3 are inputted to or outputted from the memory cell array in one operation.

The memory cell array has a memory cell unit MEM, word decoders WD located on opposite sides (left and right of the figure) of the memory cell unit MEM, sense amplifiers SA located on the other opposite sides (upper and lower of the figure) thereof, and cross regions CRS located at the four corners thereof. The memory cell unit MEM includes a plurality of memory cells MC arranged in a matrix.

The word decoders WD each activate (select) one of word lines WL in accordance with a row address. The word lines WL are connected to the gates of the transfer transistors of the memory cells MC. The activation of a word line allows data stored in the capacitors of the associated memory cells MC to be read out onto the respective bit lines BL (or /BL).

The sense amplifiers SA, which are connected to the respective complementary pairs of bit lines BL and /BL, amplify the data read onto the bit lines BL (or /BL). In the cross regions CRS, there are located switches of data buses (not shown); contacts for switching the wiring layers of the data buses; buffers of control signal lines of the sense amplifiers SA; and so on.

FIG. 2 illustrates read and write operations of the DRAM described above. Hereafter, the names of signals may be accompanied by the same reference designations as the signal lines through which those signals are transferred; for example, the signal transferred through a word line WL will be referred to as word line signal WL.

During a read operation, a given word line signal WL (e.g., WL shown by a thick line in FIG. 1) changes, in accordance with a corresponding row address, to a high level, which turns on the transfer transistors of the memory cells MC connected to the word line WL. The data held by the memory cells MC (high levels in this example) are transferred to the respective bit lines BL, so that the voltages of those bit lines BL go up (FIG. 2(*a*)). It should be appreciated that before the read operation, the bit lines BL and /BL are set to a precharging voltage that is a reset voltage.

Next, a latch enable signal LE that is a control signal for controlling the sense amplifiers SA changes to a high level, causing all the sense amplifiers SA shown in FIG. 1 to commence their operations (FIG. 2(*b*)). These operations of the sense amplifiers SA amplify the voltage differences of the pairs of bit lines BL and /BL (FIG. 2(*c*)). That is, the data of all the memory cells connected to the word line WL are amplified.

Next, a given column selecting signal CL changes, in accordance with a corresponding column address, to a high level (FIG. 2(*d*)), which turns on column switches (not shown) connected to the four sense amplifiers SA corresponding to data signals DQ0–3. Out of the pairs of bit lines BL and /BL on which the read data have been amplified, the four pairs of bit lines BL and /BL selected by the column address (e.g., the bit lines BL and /BL shown by thick lines in FIG. 1) are connected to the associated data buses (not shown). Then, the four-bit read data DQ0–3 are outputted to the data buses. Thereafter, the column selecting signal CL, word line signal WL and latch enable signal LE sequentially change to their respective low levels, so that the read operation of the memory cell array is completed (FIG. 2 (*e*)).

It should be appreciated that the data read from the memory cells MC and amplified by the sense amplifiers SA are written into the memory cells MC again. An interval designated by HLD in FIG. 2 is a hold interval required to hold the data on the bit lines BL and /BL so as to rewrite the data into the memory cells MC.

During a write operation, as during the read operation, a given word line signal WL changes to a high level, and the data held in the associated memory cells MC (in this example, high levels) are transferred to the respective associated bit lines BL (FIG. 2(*f*)). Next, a latch enable signal LE changes to a high level, and the voltage differences of the pairs of bit lines BL and /BL are amplified (FIG. 2(*g*)).

During the amplifying operation of the sense amplifiers SA, write data are supplied to the pairs of bit lines BL and /BL selected by a column address (e.g., the bit lines BL and /BL shown by the thick lines in FIG. 1). In this example, the data held in the corresponding memory cells MC are different from the write data therein. For this reason, the data amplified by the corresponding sense amplifiers SA are inverted in accordance with the write data (in this example, low levels) (FIG. 2(*h*)). That is, the write operation requires an inverting time TR that is not existent in the read operation. The write data are fully amplified by the corresponding sense amplifiers SA and then written into the corresponding memory cells MC.

With respect to the memory cells MC into which data are not written during the write operation, the data read therefrom to the bit lines BL and /BL are rewritten thereinto (a refreshing operation). That is, the data on pairs of the bit lines BL and /BL that are not selected by the column address are amplified by the corresponding sense amplifiers SA and then rewritten into the corresponding memory cells MC.

Thereafter, the column selecting signal CL, word line signal WL and latch enable signal LE sequentially change to their respective low levels, so that the write operation of the memory cell array is completed (FIG. 2(*i*)). Another interval designated by HLD in FIG. 2 is a hold interval required to hold the data on the bit lines BL and /BL so as to write the data into the memory cells MC.

It should be appreciated that when the data held in the memory cells MC are inverted in accordance with the write data during the write operation, the voltages of the corresponding pairs of bit lines BL and /BL change largely, as shown in FIG. 2. This voltage change is propagated, as coupling noise, to the adjacent other bit lines BL and /BL. The smaller the wiring pitch of the bit lines BL and /BL, and the larger the voltage differences of the pairs of bit lines BL and /BL, the greater the affections on the adjacent bit lines BL and /BL.

Recently, finer patternings of semiconductor processes have permitted to provide smaller-sized memory cells. Accordingly, the wiring pitches of the word lines WL and bit lines BL and /BL have been the smaller, and hence the coupling capacitances have become the larger. Therefore, the affections of the coupling noise on the adjacent bit lines BL and /BL have been apt to be the larger.

In the DRAM described above, during the write operation, data are written into only a part of the selected memory cells MC (in the example of FIG. 1, four bits), while the original data are rewritten into the remaining memory cells MC. Consequently, the pairs of bit lines BL and /BL that are adjacent to the pairs of bit lines BL and /BL through which the write data are transferred (the pairs of bit lines BL and /BL shown by the thick lines in FIG. 1) are the most likely to receive coupling noise caused by the write data. Consequently, there is a possibility of destruction of the data held in the memory cells in the rewrite operation.

During the write operation, the write data are supplied after the data read from the memory cells MC have been amplified to some degree (FIG. 2(g, h)). However, the greater the degree to which the data read from the memory cells MC are amplified, disadvantageously the longer the inverting time TR. In general, the write and read cycle times, which are product specifications, are established as being equal to each other in order that the systems including DRAMs may be easy to use. Thus, when the write operation time is longer, the product specification of cycle time including the read operation (a timing specification) must be established as being accordingly longer.

The sense amplifiers SA must be arranged in accordance with the layouts of the memory cells MC and pairs of bit lines BL and /BL. Accordingly, the width of the layout of the sense amplifiers SA (in the lateral direction of FIG. 1) is apt to become smaller as the patternings of the semiconductor processes become finer. Accordingly, the shape of the layout of the sense amplifiers SA is narrower and longer in the vertical direction of FIG. 1 so that the layout design is difficult. Besides, the cross regions CRS also must be relatively small, so that the layouts of the switches of the data buses and the like are difficult.

The followings are recitations of the prior arts related to the present invention.

Japanese Unexamined Patent Application Publication No. Sho 61-206254 discloses a technique wherein power supply wires are provided between adjacent bit lines so as to prevent malfunction.

Japanese Unexamined Patent Application Publication No. Hei 2-91884 discloses a technique wherein the bit lines adjacent to the ones connected to memory cells to be accessed are fixed to a precharge voltage so as to prevent malfunction.

Japanese Unexamined Patent Application Publication No. 2002-32994 discloses a technique wherein the bit lines adjacent to the ones connected to memory cells to be accessed are grounded so as to prevent malfunction.

SUMMARY OF THE INVENTION

It is an object of the present invention to reduce coupling noise occurring between the bit lines connected to the memory cells, thereby preventing malfunction of semiconductor memories.

According to one of the aspects of the semiconductor memory of the present invention, a memory cell array have a plurality of memory cells; a word line connected to the memory cells; bit lines connected to the memory cells, respectively; and a plurality of sense amplifiers connected to the bit lines, respectively, for amplifying data on the bit lines in response to activation of the word line. The memory cell array is partitioned into a plurality of memory regions each of which is a unit of data input/output and includes a predetermined number of the sense amplifiers. A dummy region is formed between every two memory regions and has a dummy bit line that is set to a predetermined voltage at least during the operation of the memory cell array. Since the dummy bit line is wired between the bit lines of two adjacent memory regions, it is able to prevent voltage change in the bit lines in any of the memory regions from affecting the bit lines in the other memory regions.

During a write operation, for example, write data are supplied to the bit lines of a selected memory region. All the sense amplifiers in the memory cell array operate in response to selection of the word line. In the memory regions that are not related to the write operation, data read from the memory cells onto the bit lines are amplified by the sense amplifiers and then rewritten into the memory cells. At this point, having the dummy bit line prevents noise of the write data from being conveyed to the bit lines that are being used for the rewrite operation. As a result, the rewrite data are prevented from being destroyed during the write operation.

According to the present invention, the operation of a memory region into which data are written do not affect the operations of the other memory regions into which data are rewritten, as described above. Thus, it is possible to set the timing at which write data are inputted to the bit lines during the write operation without the timing during the rewrite operation taken into account. More specifically, the write data may be inputted to the bit lines before the sense amplifiers amplify the rewrite data. As a result, the write operation time can be shortened.

According to another aspect of the semiconductor memory of the present invention, column switches connected to the bit lines turn on concurrently for each of the memory regions, to connect the bit lines to a data bus. That is, by controlling the column switches, input/output of data, which are written to or read from the memory cell, can be made on a memory region basis.

According to another aspect of the semiconductor memory of the present invention, the on-timing of the column switches during the write operation is set to be earlier than the on-timing of the column switches during the read operation. For this reason, write data can be inputted to the bit lines before the sense amplifiers amplify rewrite data as described above, which can shorten the write operation time. In general, since the write operation requires an interval for inverting data, the write operation time is longer than the read operation time. According to the present invention, however, the interval for inverting data is not necessary, so that the write operation time can be nearly equal to the read operation time. As a result, the operation cycle, which is a product specification, can be shortened.

According to another aspect of the semiconductor memory of the present invention, each of the memory regions is an input unit of write data into the memory cells. Forcible data inversion on the bit lines is not required in the read operation, so that the noise caused by a voltage change in the bit lines is small. As a result, memory regions are set to be units of inputting write data during the write operation, by which malfunction of the memory cell arrays can be prevented without fail.

According to another aspect of the semiconductor memory of the present invention, a write masking function inhibits writing of a part of plural-bit write data to the memory cells. The memory regions are units of masking write data. During masking the write data, data is rewritten to memory cells corresponding to the masked bits. Thus, setting memory regions as masking units of write data can minimize the number of the dummy regions and prevent malfunction of the memory cell arrays in a semiconductor memory having the write masking function.

According to another aspect of the semiconductor memory of the present invention, in the dummy region a dummy sense amplifier is formed between two adjacent sense amplifiers. The formation of the dummy sense amplifier in a free space (dummy region) between the adjacent sense amplifiers can ensure supply of a predetermined voltage to the dummy bit line.

According to another aspect of the semiconductor memory of the present invention, the dummy bit line is connected to power supply lines. Since the dummy bit line has a predetermined fixed voltage, malfunction which would otherwise occur due to coupling noise of the bit lines can be prevented without fail.

According to another aspect of the semiconductor memory of the present invention, signal lines are wired by use of a plurality of wiring layers in the alignment direction of the sense amplifiers in respective regions where the sense amplifiers are formed. In the dummy region formed is a contact hole for interconnecting the signal lines, and it is located between the sense amplifiers in the two adjacent memory regions to each other. The dummy regions are formed with predetermined intervals in the alignment direction of the sense amplifiers. This facilitates formation of a layered wiring which reduces the wiring resistance of the signal lines, shortening the propagation delay time of the signals transferred through the signal lines. That is, the access time can be shortened.

According to another aspect of the semiconductor memory of the present invention, in the dummy region formed is a buffer circuit for transmitting control signals to a signal line wired in the alignment direction of the sense amplifiers, the buffer circuit being located between the sense amplifiers in the two adjacent memory regions. For this reason, the propagation delay of the control signals can be minimized, so that the memory operation can be controlled at a high speed. As a result, the access time can be shortened.

According to another aspect of the semiconductor memory of the present invention, in the dummy region formed is a data bus switch for interconnecting a plurality of data buses. The dummy regions are formed with predetermined intervals in each memory cell array. Thus, the data bus switch is placed in a dedicated region, on the contrary that it is conventionally formed in the sense amplifier regions or the like. Using the dummy region can abate the restrictions on the layouts of the transistors and the like forming the data bus switch, so that the performance of the data bus switch can be improved.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Embodiments of the present invention will be described below with reference to the drawings.

Figure 1:
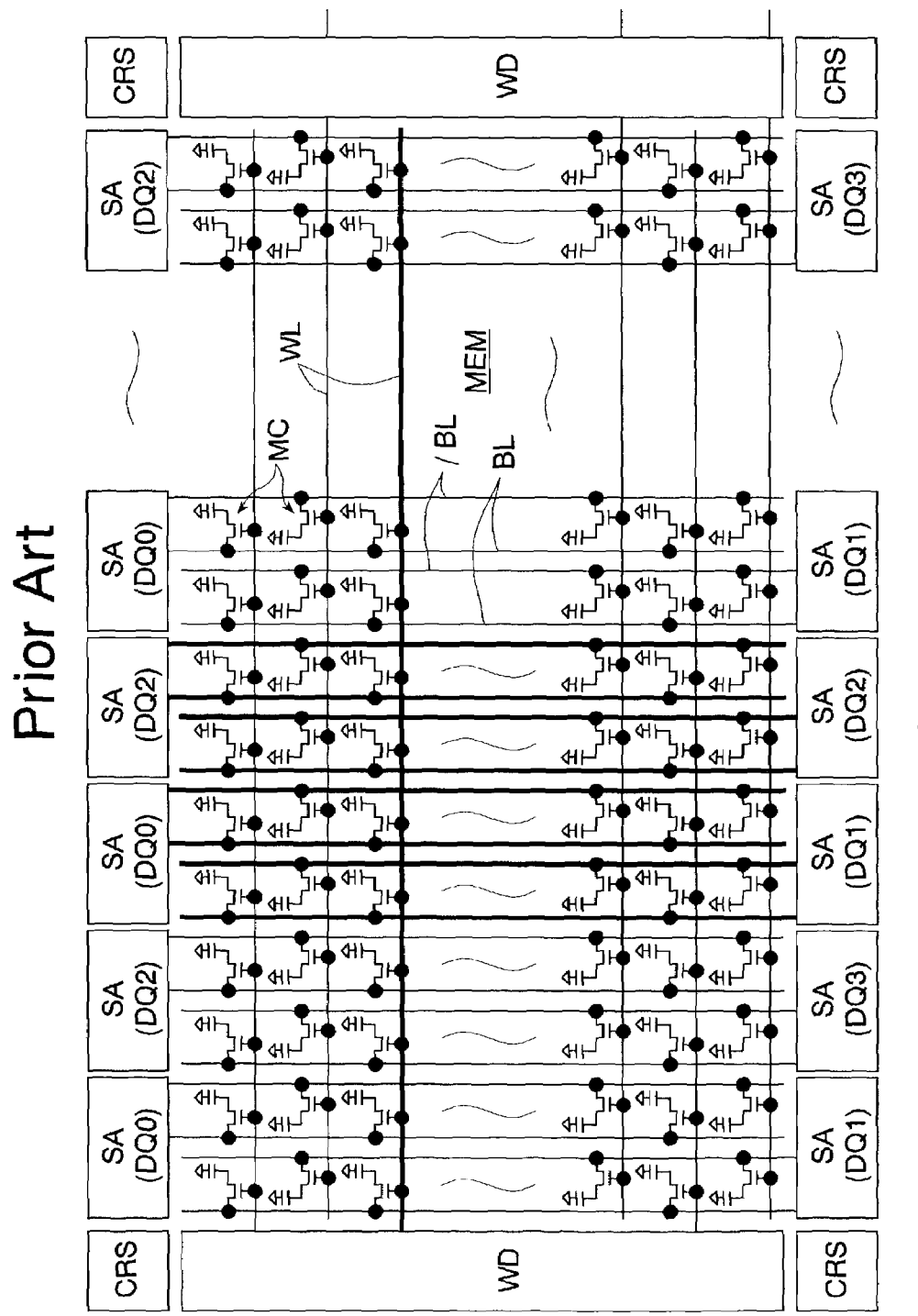
FIG. 1 is a block diagram showing a conventional memory cell array.
Figure 3:
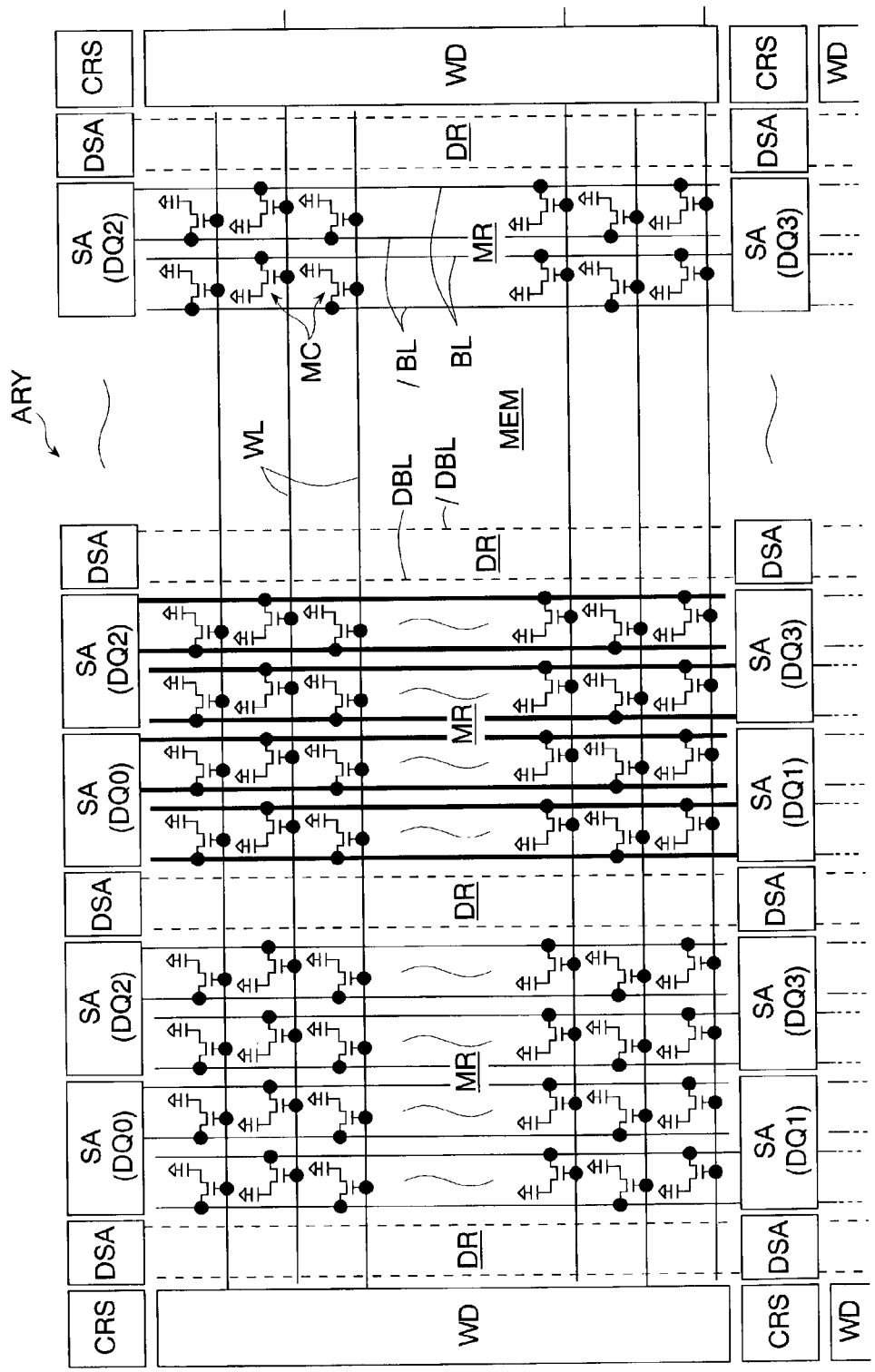
FIG. 3 is a block diagram showing a first embodiment of the present invention.

Referring to FIG. 3, there is shown a first embodiment of semiconductor memory according to the present invention. In this embodiment, elements corresponding to the same elements in the prior art of FIG. 1 are identified by the same reference designations and their detailed descriptions are omitted.

This semiconductor memory is formed, as a DRAM, on a silicon substrate by use of a CMOS process. The DRAM has a plurality of memory cell arrays ARY. Four-bit data are inputted to or outputted from each memory cell array ARY in one operation.

Each memory cell array ARY has a memory cell unit MEM; word decoders WD located on opposite sides (left and right of the figure) of the memory cell unit MEM; sense amplifiers SA located on the other opposite sides (upper and lower of the figure) thereof; and cross regions CRS located at the four corners thereof. The memory cell unit MEM includes a plurality of memory cells MC arranged in a matrix.

In this embodiment, each memory cell array ARY is partitioned into a plurality of memory regions MR. Each memory region MR has four sense amplifiers SA corresponding to four-bit data DQ0–3; four pairs of bit lines BL and /BL also corresponding thereto; and memory cells MC connected to those pairs of bit lines BL and /BL. That is, each memory region MR is a partition for every four-bit data that is to be inputted or outputted in one write or read operation of the memory cell array ARY.

There are formed dummy regions DR each between the adjacent memory regions MR. There are also formed pairs of dummy bit lines DBL and /DBL in the regions of the dummy regions DR that are adjacent to the pairs of bit lines BL and /BL. The pairs of dummy bit lines DBL and /DBL have the same wiring width and pitch as the pairs of bit lines BL and /BL. This prevents the formation of the dummy bit lines DBL and /DBL from compromising the regularity of the wirings in the memory cell units MEM. As a result, the layout design and data of the memory cell units MEM can be prevented from being complicated.

In the dummy regions DR dummy sense amplifiers DSA are formed in the respective regions thereof that are adjacent to the sense amplifiers SA. The dummy sense amplifiers DSA always supply a precharge voltage to the dummy bit lines DBL and /DBL. It should be appreciated that the dummy sense amplifiers DSA may be adapted to supply the precharge voltage to the dummy bit lines DBL and /DBL only during the write operation.

Figure 4:
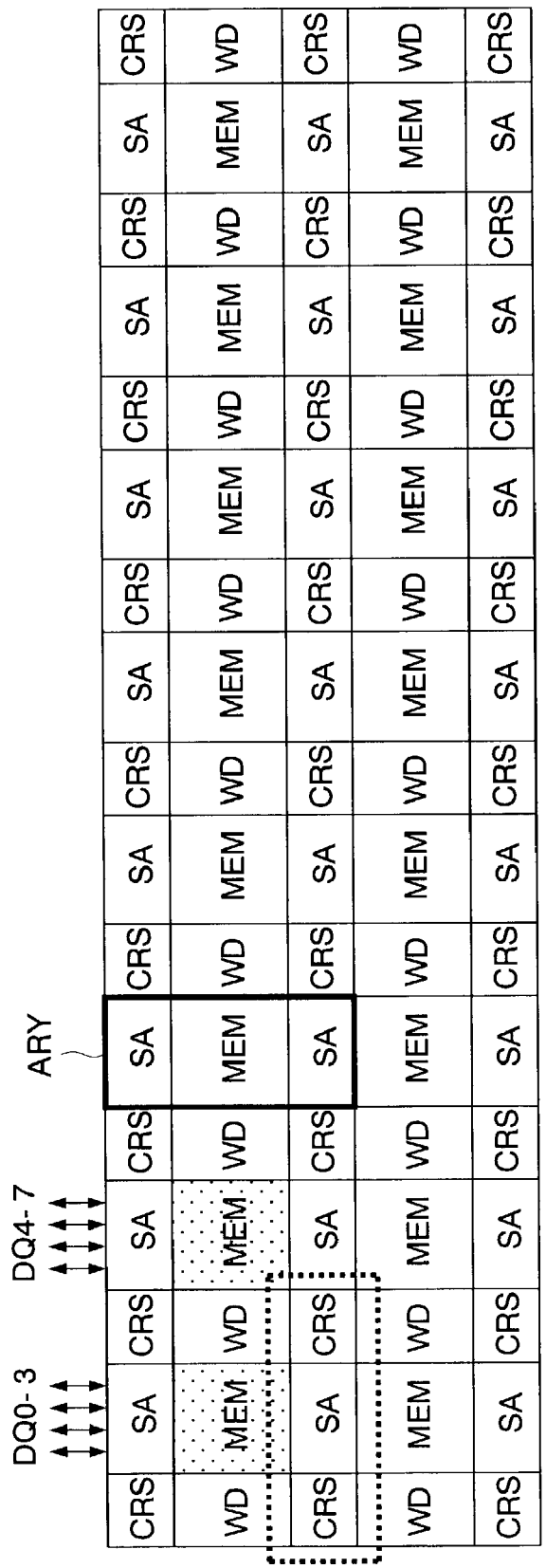
FIG. 4 is a block diagram showing the bit configuration of the memory cell arrays of FIG. 3.

FIG. 4 shows the bit configuration of the memory cell arrays ARY. Herein, each memory cell array ARY includes one memory cell unit MEM and the sense amplifiers SA arranged along both sides thereof, as enclosed by thick solid lines in the figure. The sense amplifiers SA arranged midway along the vertical direction of the figure are shared by the memory cell units MEM on both sides thereof in the vertical direction of the figure. That is, the present embodiment employs a shared sense amplifier system.

The DRAM has sixteen memory cell units MEM. As shown by shading in the figure, two of the memory cell units MEM are selected for operation in response to a row address (upper address; the higher order bits of an address signal). During a read operation, data DQ0–3 and DQ4–7 are outputted from the two respective operating memory cell units MEM. During a write operation, data DQ0–3 and DQ4–7 are inputted to the two respective operating memory cell units MEM.

Figure 5:
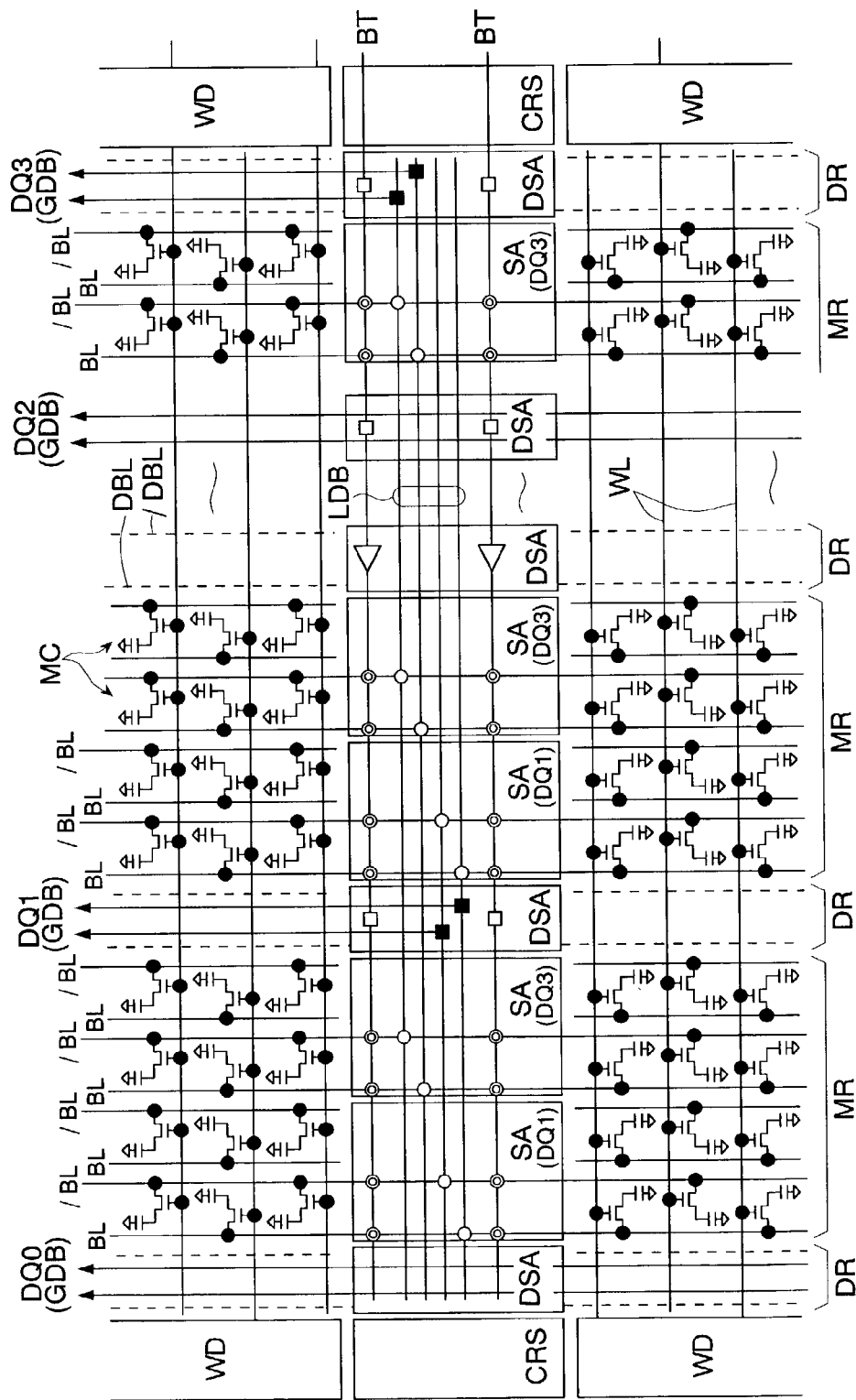
FIG. 5 is a block diagram showing the details of an essential portion of FIG. 3.

FIG. 5 shows the details of the regions enclosed by thick dashed lines in FIG. 4.

In the layout regions of the sense amplifiers SA and dummy sense amplifiers DSA, there are wired a local data bus LDB and signal lines of bit line selecting signals BT along the direction of alignment of the sense amplifiers SA and dummy sense amplifiers DSA. Each of the signal lines of the bit line selecting signals BT is wired in two upper and lower layers by use of two wiring layers. White squares shown in the figure represent contact holes for interconnecting the signal lines of the bit line selecting signals BT formed in the two upper and lower layers. The two-layer structure of the signal lines of the bit line selecting signals BT can reduce the wiring resistance and hence shortens the operation time of the sense amplifiers SA. As a result, the access time can be shortened.

In some of the dummy regions DR, there are formed buffer circuits (represented by triangles in the figure) that are used to transfer the bit line selecting signals BT on the signal lines thereof. The insertion of these buffer circuits in the signal lines of the bit line selecting signals BT can minimize the propagation delay of the bit line selecting signals BT. As a result, the connection of the pairs of bit lines BL and /BL to the sense amplifiers SA can be controlled at a high speed, independently of the layouts.

It should be appreciated that the wiring of two upper and lower layers and the insertion of buffer circuits may be applied not only to the signal lines of the bit line selecting signals BT but also to the signal line of a latch enable signal LE that is a sense amplifier activating signal for controlling the operations of the sense amplifiers SA (as will be described later with reference to FIG. 6) so as to allow the sense amplifiers SA to operate at a high speed, thereby further shortening the access time.

The bit line selecting signals BT control BT switches (represented by double circles in the figure) that are used to connect the sense amplifiers SA to the respective pairs of bit lines BL and /BL. The bit line selecting signals BT disconnect the pairs of bit lines BL and /BL of the memory cell array ARY on the lower side of the figure from the sense amplifiers SA when the memory cell array ARY on the upper side of the figure operates.

The pairs of bit lines BL and /BL are connected to the local data bus LDB via the BT switches and also via column switches represented by white circles in the figure. The column switches are turned on when column selecting signals CL, which will be described later, exhibit a high level.

The local data bus LDB is connected, at the dummy sense amplifiers DSA, to global data buses GDB formed in the wiring regions of an overlying layer. Black squares shown in the figure represent data bus switches for connecting the local data bus LDB to the global data buses GDB. Conventionally, such data bus switches are formed, by constraint, in the regions where the sense amplifiers SA are formed. The formation of the data bus switches in the dummy regions DR can relax restrictions on the layout of the transistors forming the data bus switches as compared with the conventional technique. Accordingly, for example, large-sized transistors may be used to improve the switching speed.

Each global data bus GDB is wired, for each bit of the data DQ0–3, over a dummy region DR and along the bit lines BL and /BL. Utilizing the dummy regions DR allows the global data buses GDB to be wired with enough wiring width thereof ensured. As a result, the wiring resistance of the global data buses GDB can be reduced.

Figure 6:
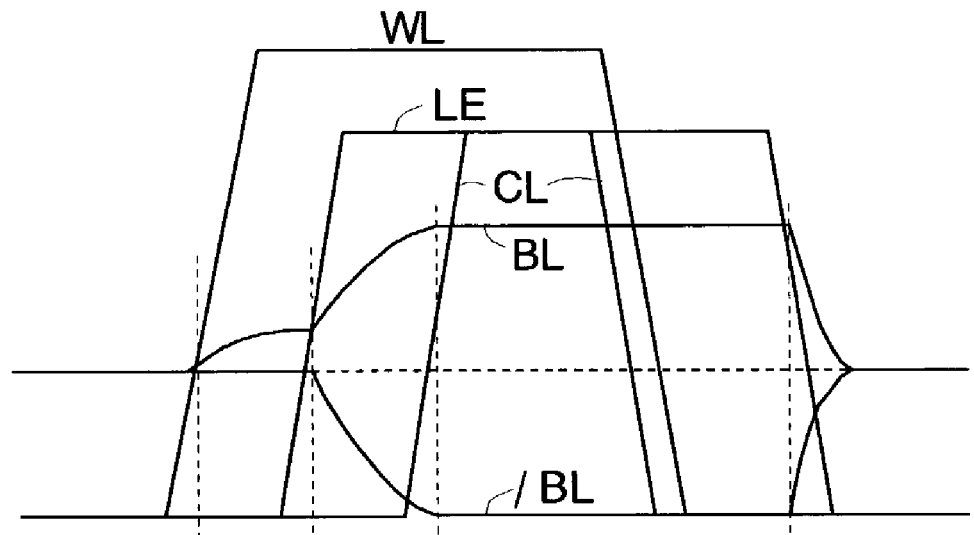
FIG. 6 is a timing diagram showing operations of the memory cell arrays in the first embodiment.
Figure 6:
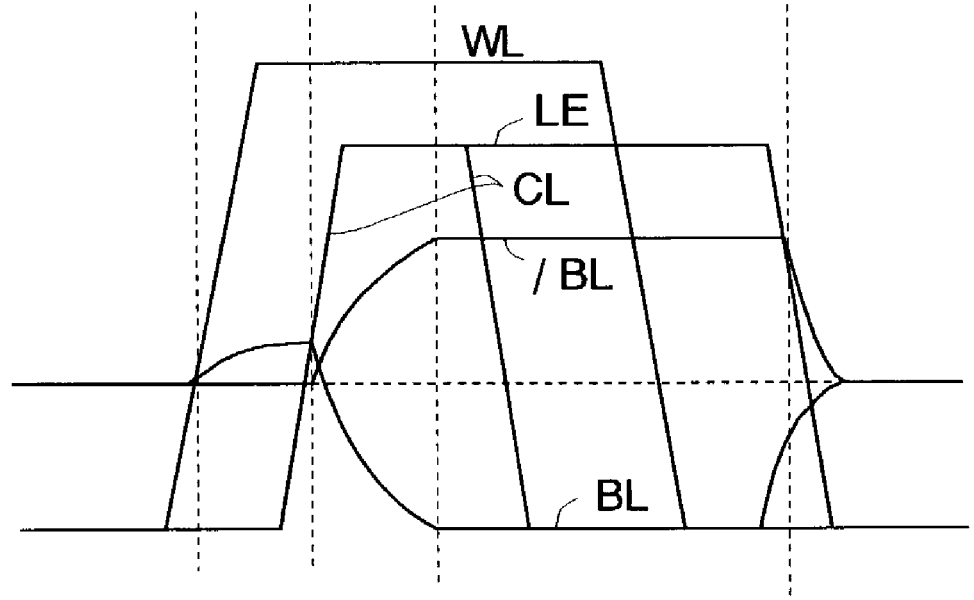

FIG. 6 illustrates the read and write operations of the DRAM described above. Detailed descriptions will be omitted with respect to operations corresponding to the same operations of the prior art of FIG. 2.

Figure 2:
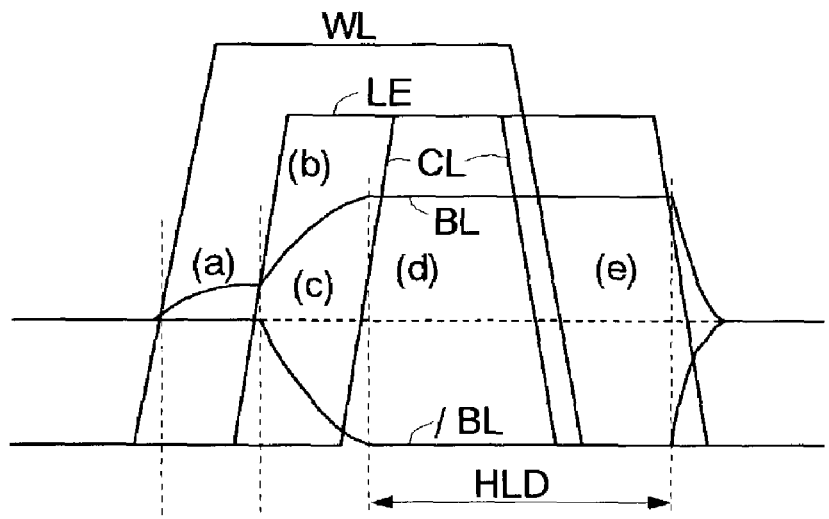
FIG. 2 is a timing diagram showing operations of the conventional memory cell array.
Figure 2:
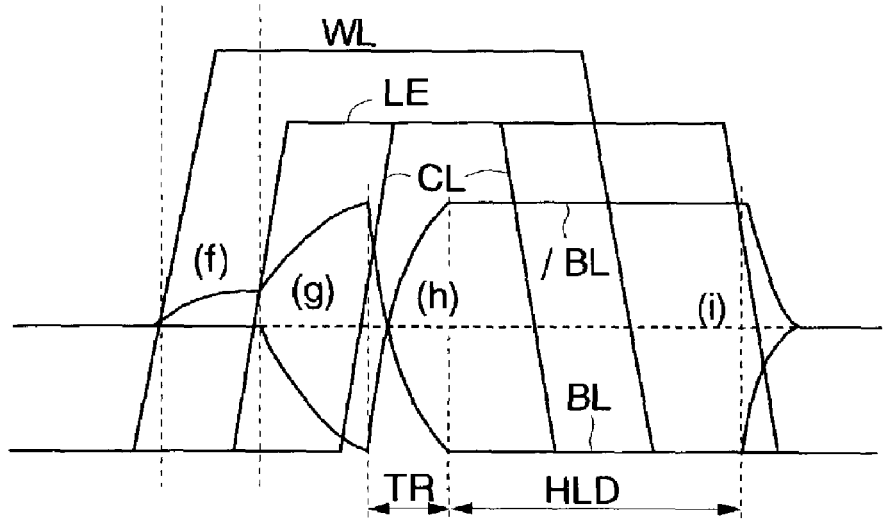

The read operation is the same as in FIG. 2, however, It should be appreciated that according to the present invention, the wiring resistances of the local data bus LDB and global data buses GDB can be reduced and the propagation delay of the bit line selecting signals BT can be minimized, so that the read operation cycle can be shortened as compared with the prior art.

During the write operation, as previously described, the operations of two memory cell arrays ARY cause four-bit data DQ0–3 and DQ4–7 to be written into memory cells MC. For example, the column switches of the memory regions MR selected in accordance with column addresses are turned on, and write data are transferred to the pairs of bit lines BL and /BL shown by the thick lines in FIG. 3. That is, the column switches are turned on for each memory region MR.

Each dummy bit line DBL that is set to the precharge voltage is wired between a pair of bit lines BL and /BL through which the write data is transferred (which will be also referred to as "write pair of bit lines BL and /BL" hereinafter) and another pair of bit lines BL and /BL. This can suppress coupling noise occurring between the write pair of bit lines BL and /BL and the other pair of bit lines BL and /BL. In other words, during the write operation, the data on the pairs of bit lines BL and /BL adjacent to the write pairs of bit lines BL and /BL (i.e., rewrite data) are not affected by the write data.

Thus, even when the write data are supplied to the write pairs of bit lines BL and /BL without waiting for the amplification by the sense amplifiers SA, the rewrite data can be correctly written into the memory cells MC. More specifically, during the write operation, the column selecting signals CL are generated earlier than during the read operation. As a result, the inverting time TR as shown in FIG. 2 is not needed, and the write operation time is nearly equal to the read operation time. That is, the operation cycle time to execute the write operation can be shortened, so that the data transfer rate of the system including the DRAM can be improved.

In the present embodiment described above, each memory cell array ARY was partitioned into a plurality of memory regions MR each of which was a unit of inputting and/or outputting the data and between which a respective pair of dummy bit lines DBL and /DBL was wired. This can prevent the voltage change in the bit lines BL and /BL of a memory region MR from affecting the bit lines BL and /BL of the other adjacent memory regions MR and prevent the coupling noise of the bit lines BL and /BL from causing malfunction of the memory cell arrays ARY. Especially, since the memory regions MR each are established as a unit of inputting the write data into the memory cells MC, the write data into a given memory region MR can be prevented from affecting the data to be rewritten into the other memory regions MR. That is, the rewrite data can be prevented from being destroyed during the write operation.

Since the timing of inputting to the bit lines BL and /BL the write data during the write operation can be set without the timing of the rewrite operation taken into account, the write operation time can be shortened. As a result, the write operation time can be set to be nearly equal to the read operation time, so that the operation cycle, which is a product specification, can be shortened.

Since the contact holes for interconnecting the signal lines having a layered structure are formed in the dummy regions DR, the propagation delay of the signals transferred through the signal lines can be shortened, so that the access time can be shortened.

Since the buffer circuits for the control signals are formed in the dummy regions DR, the propagation delay of the control signals can be minimized, so that the memory operation can be controlled at a high speed.

The data bus switches for connecting the local data buses LDB to the global data buses GDB are formed in the dummy regions DR. Since the data bus switches can be formed in such dedicated regions, restrictions on the layouts of the transistors and the like forming the data bus switches can be relaxed, so that performance of the data bus switches can be improved.

Figure 7:
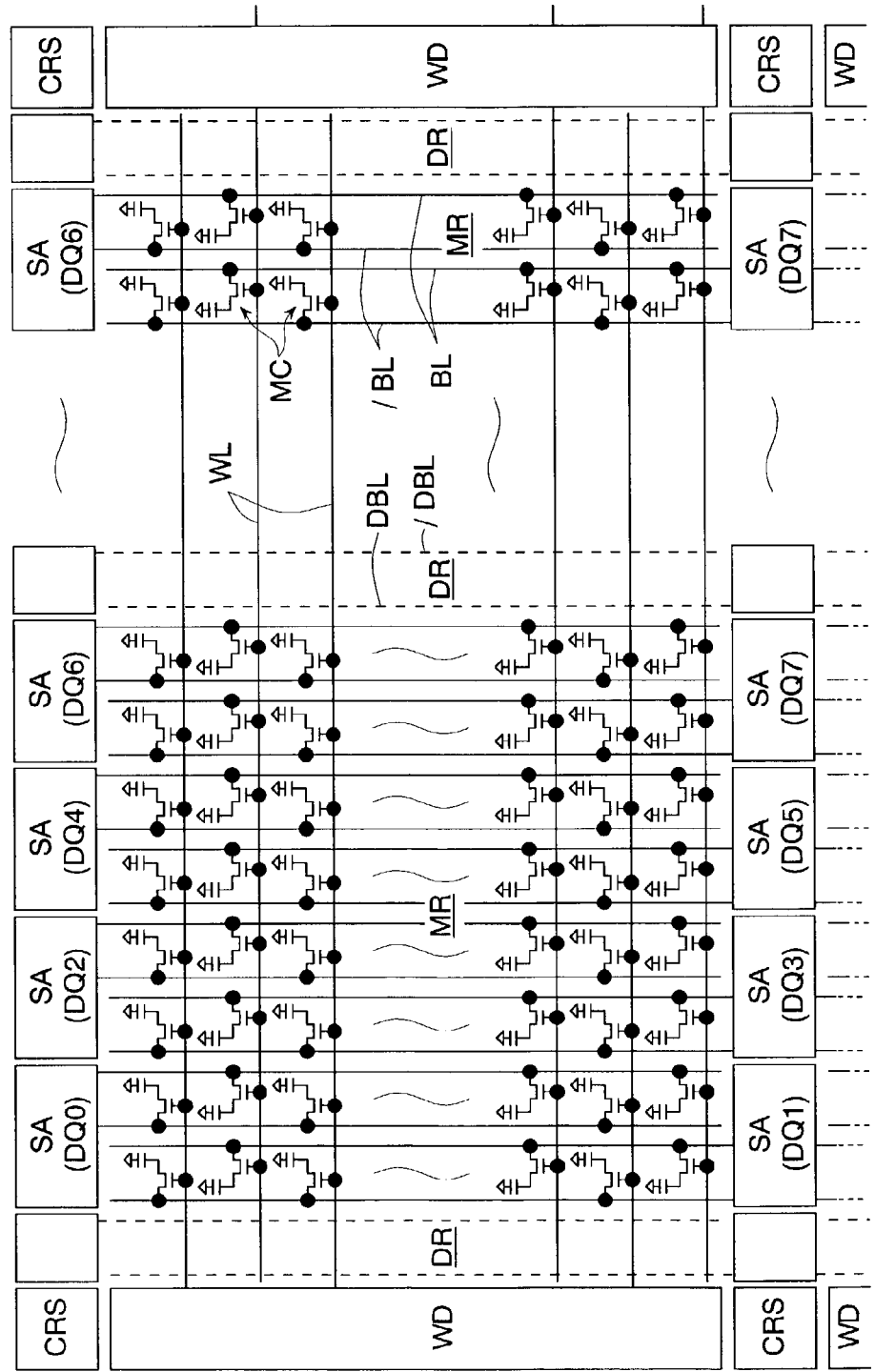
FIG. 7 is a block diagram showing a second embodiment of the present invention.

Referring now to FIG. 7, there is shown a second embodiment of semiconductor memory according to the present invention. In this embodiment, elements corresponding to the same elements in the prior art and first embodiment are identified by the same reference designations and their detailed descriptions are omitted.

In the present embodiment, a semiconductor memory is formed as a DRAM having a plurality of memory cell arrays ARY, and eight-bit data DQ0–7 are inputted to or outputted from each memory cell array ARY in one operation.

Each memory cell array ARY is configured such that memory regions MR and dummy regions DR are alternately formed as in the first embodiment. Each memory region MR has eight sense amplifiers SA corresponding to the eight-bit data DQ0–7; eight pairs of bit lines BL and /BL also corresponding thereto; and memory cells MC connected to those pairs of bit lines BL and /BL. That is, each memory region MR is a partition for every eight-bit data that is inputted or outputted in one write or read operation of the memory cell array ARY.

Each dummy region DR has a pair of dummy bit lines DBL and /DBL as in the first embodiment. The pairs of dummy bit lines DBL and /DBL are connected, at the regions corresponding to the regions where the dummy sense amplifiers DSA are formed in the first embodiment, to ground lines (power supply lines). That is, according to the present embodiment, the dummy sense amplifiers DSA are not formed. It should be appreciated that the pairs of dummy bit lines DBL and /DBL may be connected to power supply lines for supplying a precharge voltage. The other structures of the present embodiment are the same as those of the first embodiment.

Figure 8:
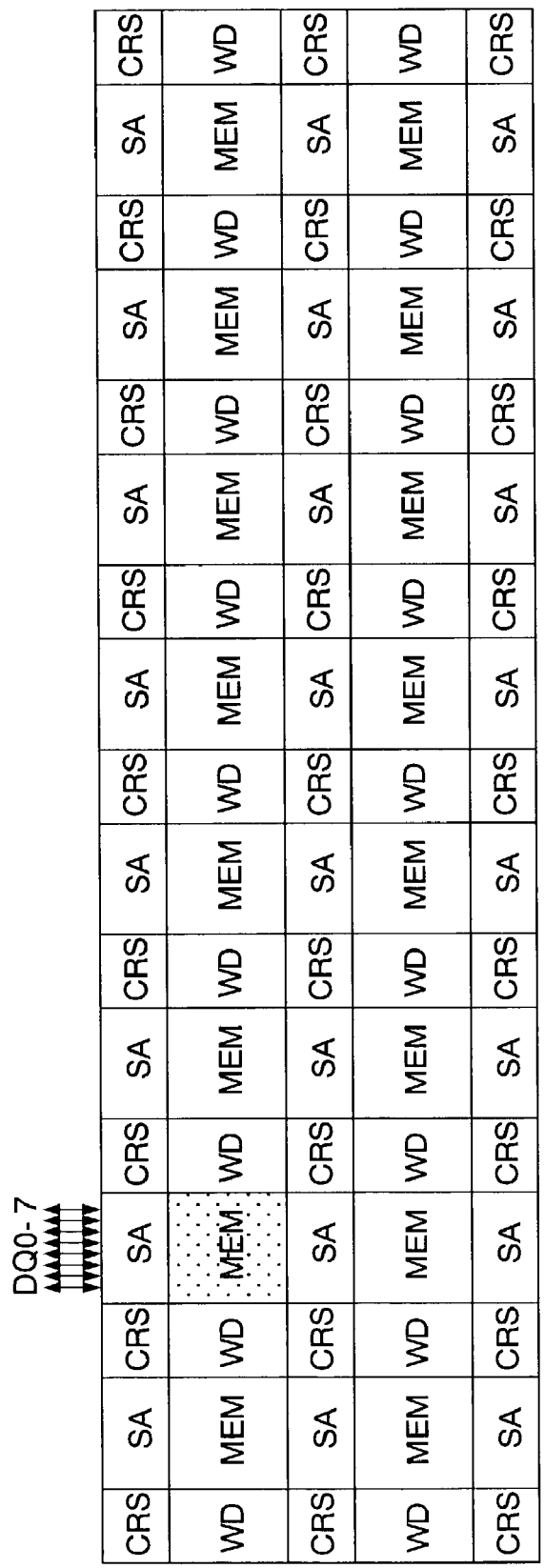
FIG. 8 is a block diagram showing the bit configuration of the memory cell arrays of FIG. 7.

FIG. 8 shows the bit configuration of the memory cell arrays ARY.

The DRAM has sixteen memory cell units MEM. As shown by shading in the figure, one of the memory cell units MEM is selected for operation in response to a row address (upper address). During the read operation, data DQ0–7 are outputted from the one operating memory cell unit MEM. During the write operation, data DQ0–7 are inputted to the one operating memory cell unit MEM. The timings of the read and write operations are the same as those of the first embodiment (FIG. 6).

The present embodiment can provide similar effects to those of the foregoing first embodiment. Besides, according to the present embodiment, since the present invention was applied to the DRAM wherein eight-bit data are inputted to or outputted from each memory cell unit MEM, the dummy regions DR each may be formed for every eighth pair of bit lines BL and /BL. As a result, the number of the dummy regions DR can be less, so that the chip size can be reduced.

Moreover, no dummy sense amplifiers DSA are formed, therefore, it is easier to form: the data bus switches for connecting the local data buses LDB to the global data buses GDB; the buffer circuits for the bit line selecting signals BT; the contact holes for interconnecting the local data buses having the layered structure; etc.

Figure 9:
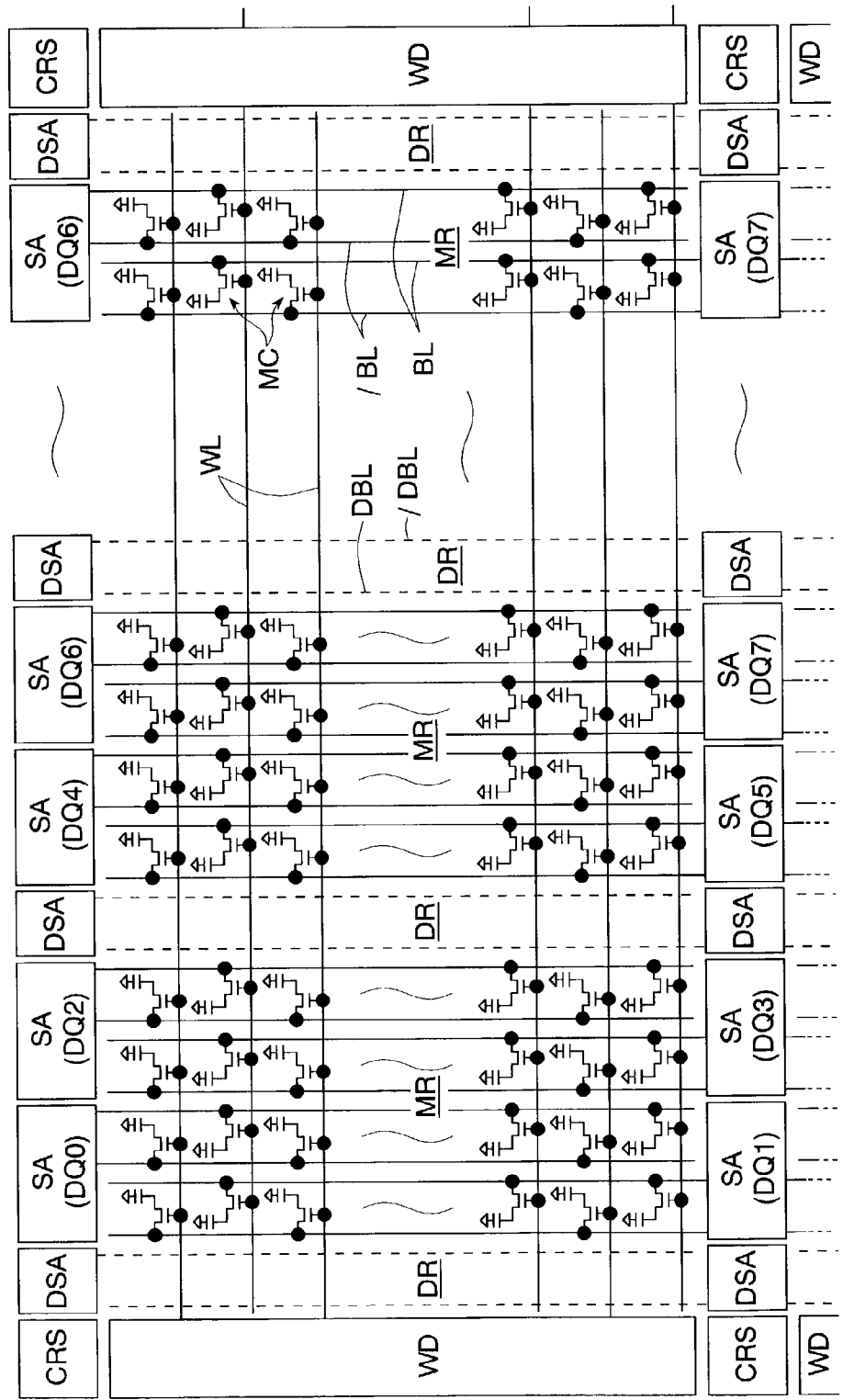
FIG. 9 is a block diagram showing a third embodiment of the present invention.

FIG. 9 shows a third embodiment of semiconductor memory according to the present invention. In this embodiment, elements corresponding to the same elements in the prior art and first embodiment are identified by the same reference designations and their detailed descriptions are omitted.

In the present embodiment, a semiconductor memory is formed as a DRAM having a plurality of memory cell arrays ARY, and eight-bit data DQ0–7 are inputted to or outputted from each memory cell array ARY normally in one operation. This DRAM has a function to mask the bits of a part of write data. When the making function is in effect, the lower-order write data DQ0–3 or higher-order write data DQ4–7 are masked. The write data is masked by keeping the column switches off that would normally be turned on. The sense amplifiers SA associated with the column switches being in off-state perform the data rewrite operation.

Each memory cell array ARY is configured such that memory regions MR and dummy regions DR are alternately formed as in the first embodiment. Each memory region MR is formed in correspondence with the data DQ0–3 or DQ4–7. That is, each memory region MR has four sense amplifiers SA corresponding to the data DQ0–3 or DQ4–7; four pairs of bit lines BL and /BL also corresponding thereto; and memory cells MC connected to those pairs of bit lines BL and /BL. The other structures of the present embodiment are the same as those of the first embodiment.

In the present embodiment, one of the memory cell units MEM is selected for operation in response to a row address (upper address). During a read operation, data DQ0–7 are outputted from the one operating memory cell unit MEM. During a normal write operation, data DQ0–7 are inputted to the one operating memory cell unit MEM. The timings of the read and write operations are the same as those of the first embodiment (FIG. 6).

During a write operation wherein four lower-order bits are masked, only the column switches corresponding to four higher-order bits are turned on, and the four-bit data DQ4–7 are inputted to a memory cell unit MEM. At this moment, the pairs of bit lines BL and /BL that would normally transfer the lower-order four-bit write data are used for the data rewrite operation. As shown in FIG. 9, there are wired pairs of dummy bit lines DBL and /DBL each between the pair of bit lines BL and /BL corresponding to the data DQ2 and the pair of bit lines BL and /BL corresponding to the data DQ5 (a write pair of bit lines BL and /BL). This can suppress the coupling noise occurring between the write pair of bit lines BL and /BL and the other pair of bit lines BL and /BL.

As a result, malfunction can be prevented from occurring due to the coupling noise between the bit lines during the mask write operation.

The present embodiment can provide similar effects to those of the foregoing first embodiment. Besides, according to the present embodiment, in the DRAM having the data write-masking function, the memory regions MR each are established as a unit of masking the write data. This can minimize the number of the dummy regions DR, and prevent malfunction of the memory cell arrays ARY.

Figure 10:
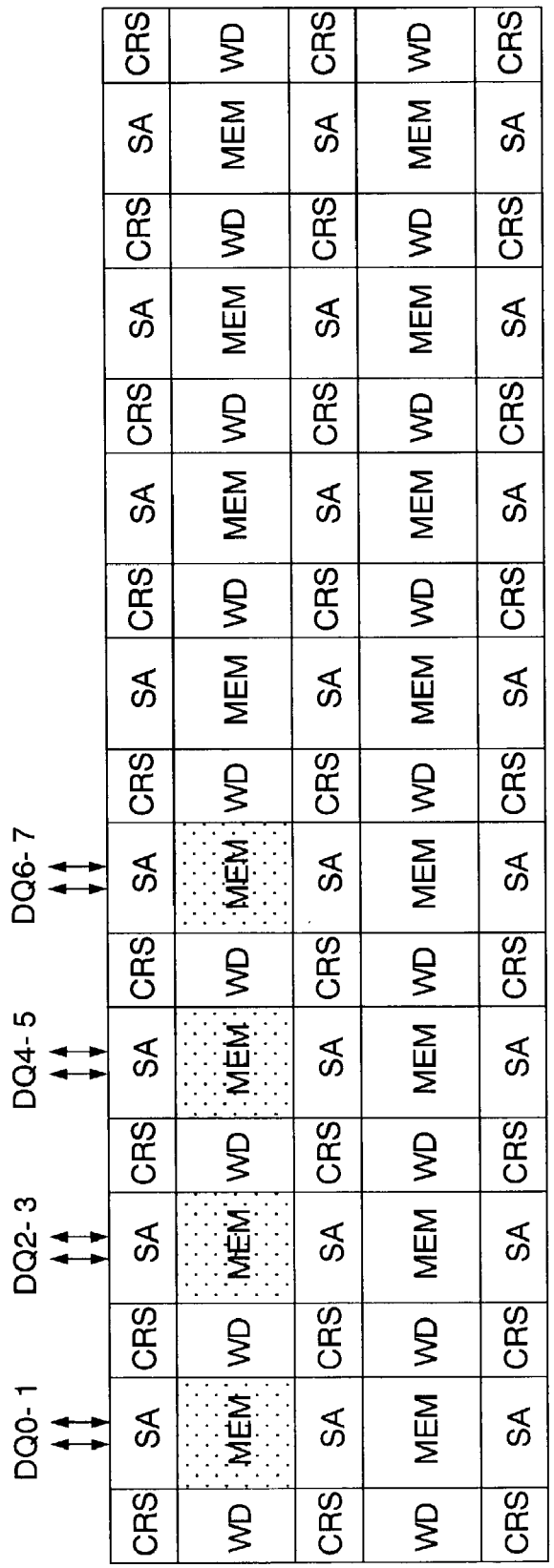
FIG. 10 is a block diagram showing another bit configuration of memory cell arrays.
Figure 11:
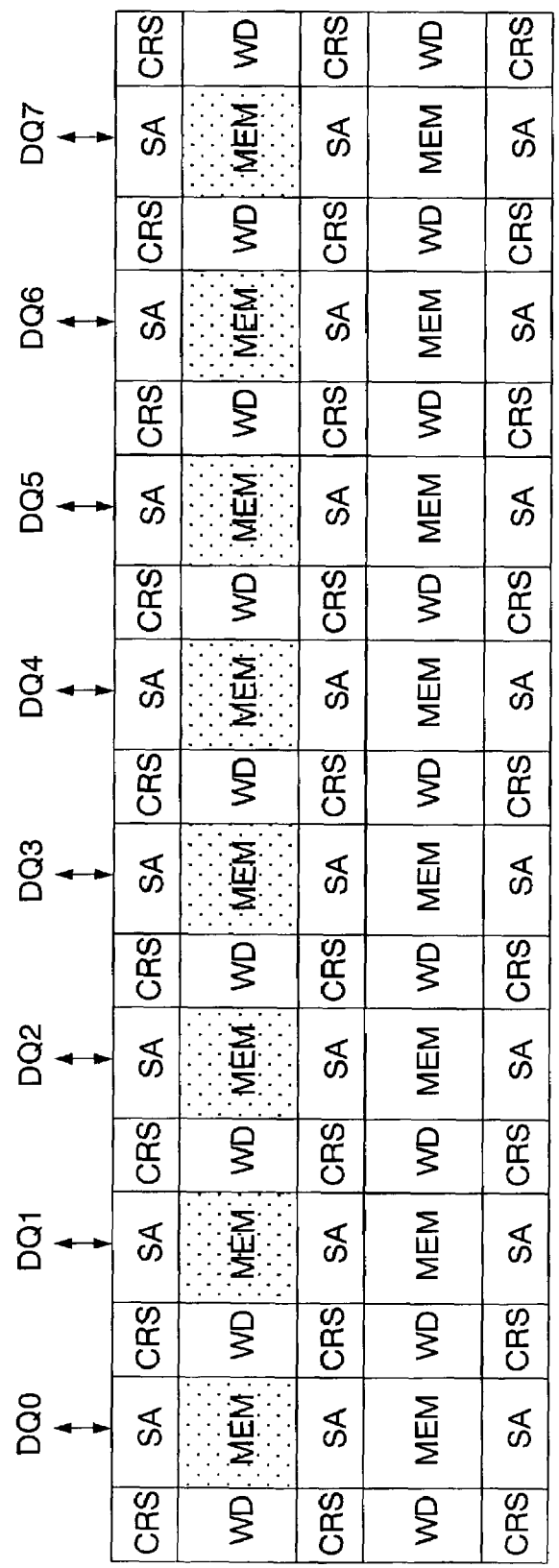
FIG. 11 is a block diagram showing still another bit configuration of memory cell arrays.

FIGS. 10 and 11 show examples for comparison.

In the example of FIG. 10, four memory cell units MEM operate such that two-bit data DQ0–1, DQ2–3, DQ4–5 and DQ6–7 are inputted to or outputted from the respective memory cell units MEM in one read or write operation. This example requires that the dummy regions DR each be formed for every second pair of bit lines BL and /BL.

In the example of FIG. 11, eight memory cell units MEM operate such that one-bit data DQ0, DQ1, DQ2, DQ3, DQ4, DQ5, DQ6 and DQ7 are inputted to or outputted from the respective memory cell units MEM in one read or write operation. This example requires that the dummy regions DR each be formed for every pair of bit lines BL and /BL.

In the examples of FIGS. 10 and 11, the numbers of the dummy regions DR are large, so that the chip sizes are large. Especially, the example of FIG. 11 requires that the number of the pairs of dummy bit lines DBL and /DBL to be formed be equal to that of the pairs of bit lines BL and /BL. This example, therefore, is not practical. Besides, since many memory cell units MEM operate in one operation, power consumption is large. In other words, according to the present invention, the greater the number of the bits of data to be inputted to or outputted from one memory cell unit MEM, the greater the advantageous effects.

The foregoing embodiments were described as examples wherein the pairs of dummy bit lines DBL and /DBL each were wired between the memory regions MR. The present invention, however, is not limited to such embodiments. For example, dummy bit lines DBL each may be wired between the memory regions MR, whereby similar effects can be obtained. In such a case, since the dummy regions DR can be small, the size of the memory cell arrays ARY can be small, resulting in a reduced manufacturing cost.

The foregoing embodiments were described as examples wherein there were formed, in the dummy regions DR, the buffer circuits for the bit line selecting signals BT to be supplied to the BT switches for connecting the pairs of bit lines BL and /BL to the sense amplifiers SA. The present invention, however, is not limited to such embodiments. For example, there may be formed, in the dummy regions DR, buffer circuits for control signals to be supplied to switches for equalizing the pairs of bit lines BL and /BL.

The foregoing embodiments were described as examples wherein the present invention was applied to DRAMs. The present invention, however, is not limited to such embodiments. For example, the present invention may be applied to Fast Cycle RAMs (FCRAMs), or to system LSIs incorporating the memory cores of DRAMs.

The invention is not limited to the above embodiments and various modifications may be made without departing from the spirit and scope of the invention. Any improvement may be made in part or all of the components.

What is claimed is:

1. A semiconductor memory comprising:
 a plurality of memory regions having a plurality of memory cells positioned in a row direction and a column direction,
 a plurality of bit lines connected to said memory cells aligned in the column direction, respectively, and a plurality of sense amplifiers connected to said bit lines, respectively, which amplifies data on said bit lines;
 a plurality of word lines each wired commonly to all of said memory regions, and each directly connected to memory cells aligned in the row direction in the memory regions;
 a word decoder connected to said word lines, and selecting one of said word lines to connect all memory cells that are in the memory regions and that are aligned in the row direction, to said bit lines; and
 a plurality of dummy regions each being formed between every two of said memory regions, said dummy regions each having a dummy bit line that is set to a predetermined voltage at least during operation of said memory cell array, wherein
 all of said sense amplifiers of all of said plurality of memory regions operate in synchronism with the selection of one of said word lines by said word decoder, in order to amplify data on all bit lines of all said memory regions and corresponding to the selected word lines,
 one of said memory regions is selected during a single write or read operation, and
 said data is input/output from/to all bit lines in the selected memory region.

2. The semiconductor memory according to claim 1, further comprising:
 a data bus for transferring data; and
 a plurality of column switches connected to said bit lines, respectively, for connecting said bit lines to said data bus, the column switches being dividedly disposed in each of said memory regions, wherein
 said column switches disposed in each of said memory regions turn on concurrently.

3. The semiconductor memory according to claim 2, wherein on-timing of said column switches during write operation is set to be earlier than on-timing of said column switches during read operation.

4. The semiconductor memory according to claim 1, wherein
 said memory regions are established as units of inputting write data which is written to said memory cell array by the single write operation.

5. The semiconductor memory according to claim 4, comprising:
 a write masking function for inhibiting writing of a part of bits of write data, which consists of a plurality of bits, to said memory cell array, wherein
 said memory regions are established as units of masking said write data.

6. The semiconductor memory according to claim 1, further comprising:
 a dummy sense amplifier being formed in each of said dummy regions, for supplying a predetermined voltage to said dummy bit line, said dummy sense amplifier being located between said sense amplifiers in the two memory regions adjacent to each other.

7. The semiconductor memory according to claim 1, wherein said dummy bit line is connected to power supply lines.

8. The semiconductor memory according to claim 1, further comprising:
 signal lines being wired by use of a plurality of wiring layers in an alignment direction of said sense amplifiers in respective regions where said sense amplifiers are formed; and a contact hole being formed in at least one of said dummy regions, for interconnecting said signal lines, said contact hole being located between said sense amplifiers in the two memory regions adjacent to each other.

9. The semiconductor memory according to claim 1, further comprising:
   a signal line being wired in an alignment direction of said sense amplifiers; and
   a buffer circuit for transmitting a control signal to said signal line,
said signal line and said buffer circuit being formed in at least one of said dummy regions and between said sense amplifiers in the two memory regions adjacent to each other.

10. The semiconductor memory according to claim 1, further comprising:
   a data bus switch being formed in at least one of said dummy regions, for interconnecting a plurality of data buses sequentially connected to said bit lines.

* * * * *